United States Patent
Warren et al.

(10) Patent No.: US 8,455,990 B2
(45) Date of Patent: Jun. 4, 2013

(54) SYSTEMS AND METHODS OF TAMPER PROOF PACKAGING OF A SEMICONDUCTOR DEVICE

(75) Inventors: Robert W Warren, Newport Beach, CA (US); Hyun Jung Lee, Aliso Viejo, CA (US); Nic Rossi, Causeway Bay (HK)

(73) Assignee: Conexant Systems, Inc., Newport Beach, CA (US)

( * ) Notice: Subject to any disclaimer, the term of this patent is extended or adjusted under 35 U.S.C. 154(b) by 179 days.

(21) Appl. No.: 12/713,141

(22) Filed: Feb. 25, 2010

(65) Prior Publication Data

US 2010/0213590 A1    Aug. 26, 2010

Related U.S. Application Data

(60) Provisional application No. 61/155,498, filed on Feb. 25, 2009.

(51) Int. Cl.
*H01L 23/58* (2006.01)
*H01L 21/50* (2006.01)

(52) U.S. Cl.
USPC ........... 257/678; 257/679; 257/774; 257/777; 257/E21.499; 257/E23.194; 438/118; 438/614

(58) Field of Classification Search
USPC ........... 257/678, E23.194, E21.499; 438/118
See application file for complete search history.

(56) References Cited

U.S. PATENT DOCUMENTS

| | | | |
|---|---|---|---|
| 5,369,299 A | 11/1994 | Byrne | |
| 5,406,630 A * | 4/1995 | Piosenka et al. | 380/52 |
| 5,920,112 A | 7/1999 | Datri et al. | |
| 7,005,733 B2 | 2/2006 | Kommerling et al. | |
| 7,335,899 B2 | 2/2008 | Blanton et al. | |
| 2006/0086534 A1 | 4/2006 | Oggioni et al. | |
| 2006/0180939 A1 | 8/2006 | Matsuno | |
| 2006/0255398 A1 | 11/2006 | Roizin et al. | |
| 2007/0205521 A1 | 9/2007 | Robinson | |
| 2008/0036598 A1 | 2/2008 | Oggioni | |
| 2009/0236752 A1 * | 9/2009 | Lee et al. | 257/777 |
| 2010/0038760 A1 * | 2/2010 | Lam et al. | 257/676 |

* cited by examiner

*Primary Examiner* — Lynne Gurley
*Assistant Examiner* — Cathy N Lam
(74) *Attorney, Agent, or Firm* — Jackson Walker L.L.P.; Christopher J. Rourk (57) ABSTRACT

A barrier layer can be attached in a semiconductor package to one or more sensitive devices. The barrier layer can be used to obstruct tampering by a malicious agent attempting to access sensitive information on the sensitive device. The barrier layer can cause the sensitive device to become inoperable if physically tampered. Additional other aspects of the protective packaging provide protection against x-ray and thermal probing as well as chemical and electrical tampering attempts.

23 Claims, 12 Drawing Sheets

SYSTEMS AND METHODS OF TAMPER PROOF PACKAGING OF A SEMICONDUCTOR DEVICE

RELATED APPLICATIONS

This application claims priority under 35 U.S.C. §119 to U.S. patent application Ser. No. 61/155,498 filed Feb. 25, 2009, which is hereby incorporated by reference.

BACKGROUND OF THE INVENTION

1. Field of the Inventions

The inventions relate generally to semiconductor packaging and specifically to semiconductor packaging that is tamper resistant.

2. Background Information

Payment card fraud is a growing epidemic. Manufacturers have made strides in improving the security of their Point of Sale PIN Entry Devices (PEDs), but vulnerabilities that can be exploited still exist. Criminals have developed sophisticated techniques to access sensitive data contained within or transmitted by point of sale (POS) devices by accessing the POS device through the integrated circuit (IC) package.

Conventional deterrents have included implementing active sensing electronics within the IC package to detect mechanical or electrical tampering. However, these methods have proven to not be completely effective, and sensitive stored data are still being accessed.

SUMMARY OF INVENTION

A semiconductor package is described that affords protection against tampering. In one embodiment, a semiconductor package comprises a barrier layer attached using a tamper-resistant adhesive to a sensitive device. The barrier layer can comprise silicon, a ceramic material or other materials commonly used in semiconductor manufacture. The layer can be a waste die which can have inactive electrical circuitry. The layer can also comprise active circuitry and/or sensor circuits. If sensor circuitry is used, bond wires to the barrier layer can be made from non-noble metals, which would be destroyed if corrosive chemicals are used in decapsulation thereby alerting the system of the chemical intrusion. In one embodiment, the barrier layer is attached using a chip-on-wire adhesive which encapsulates the bond wires to the device. An attempt to remove the protective barrier will damage the device and destroy the bond wires rendering the device inoperable. An x-ray opaque coating can also be applied to the barrier layer to inhibit probing by x-ray.

In addition, the tamper proof packaging can be used to protect multiple devices simultaneously. The protection can apply to devices that are laid out side by side or in a stacked-die configuration.

Corresponding methods of manufacture of the tamper proof packaging are also set forth in this disclosure.

Other systems, methods, features, and advantages of the present disclosure will be or become apparent to one with skill in the art upon examination of the following drawings and detailed description. It is intended that all such additional systems, methods, features, and advantages be included within this description, be within the scope of the present disclosure, and be protected by the accompanying claims.

BRIEF DESCRIPTION OF DRAWINGS

Many aspects of the disclosure can be better understood with reference to the following drawings. The components in the drawings are not necessarily to scale, emphasis instead being placed upon clearly illustrating the principles of the present disclosure. Moreover, in the drawings, like reference numerals designate corresponding parts throughout the several views.

DETAILED DESCRIPTION

A detailed description of embodiments of the present invention is presented below. While the disclosure will be described in connection with these drawings, there is no intent to limit it to the embodiment or embodiments disclosed herein. On the contrary, the intent is to cover all alternatives, modifications and equivalents included within the spirit and scope of the disclosure as defined by the appended claims.

Figure 1:
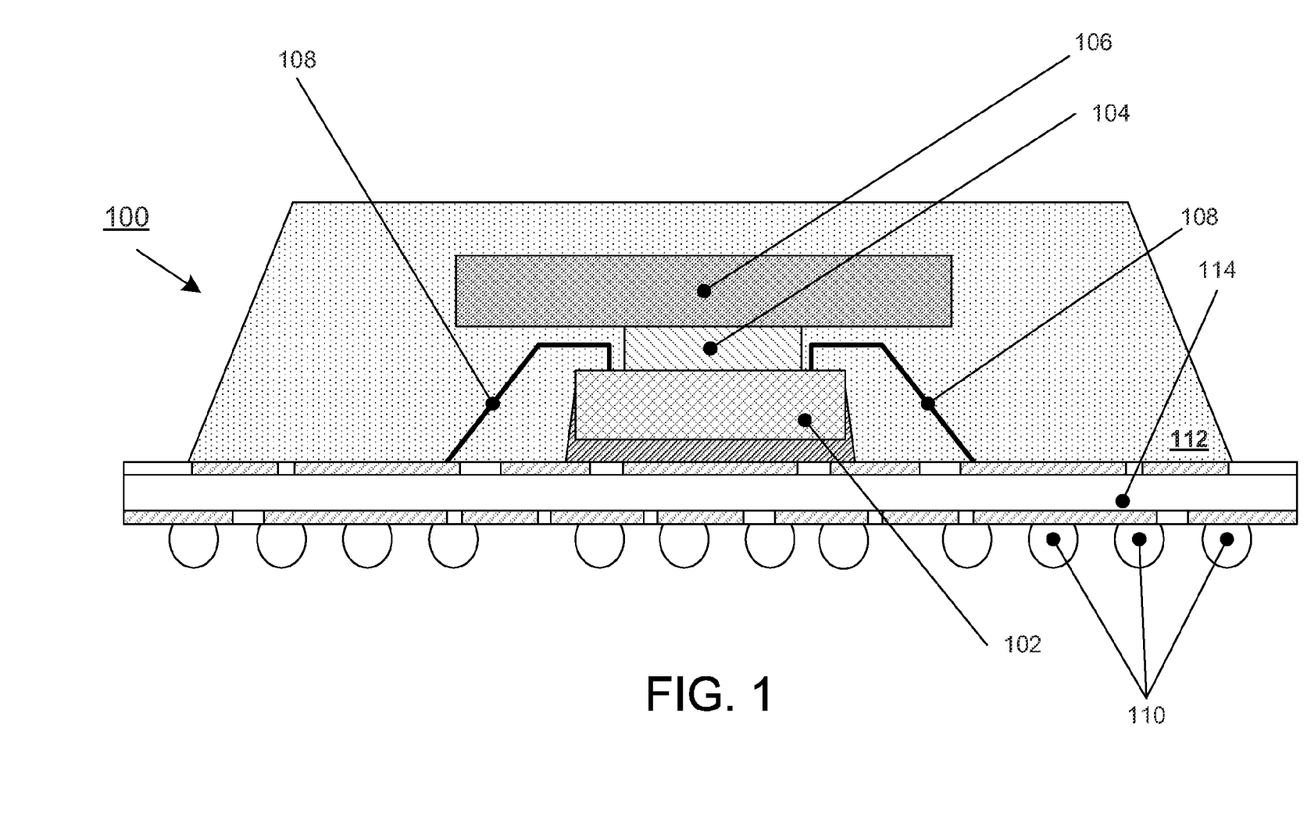
FIG. 1 illustrates a physical barrier that is mounted on top of a sensitive die, such as an IC used in a POS device, within the package.

FIG. 1 illustrates a physical barrier that is mounted on top of sensitive die 102 within package 100. A sensitive die is a fabricated semiconductor die which has sensitive circuitry fabricated upon the die. This sensitive circuitry needs protection from tampering or probing, such as integrated circuits within a POS device that might contain sensitive information such as plaintext cryptographic keys and accounting information. Sensitive die 102 is connected to output pin outs (shown here as solder balls 110) through wire bonds 108. Generally pin outs can be any type of package interfaces such as pins, solder balls, and other package I/O. More specifically a wire bond electrically couples a bond pad fabricated as part of the circuitry on the die to a bonding site on the surface of package substrate 114. Through metal lines and vias (not shown), a connection is made from the wire bond to a pin out such as one of solder balls 110.

Adhesive 104 is used to attach barrier 106 to sensitive die 102. The entire package is typically encapsulated with encapsulant 112 such as a mold compound. Barrier 106 can be made of silicon, a ceramic material, copper or other material selected to make it difficult to visually see through by visual inspection, or to physically access the secure device even if the encapsulant 112 were removed.

In one embodiment, adhesive 104 is a tamper-resistant adhesive that is resistant to chemical and physical removal. Additionally, a tamper-resistant adhesive should also create a strong bond between barrier 106 and die 102. Filled adhesives are suitable tamper-resistant adhesives. A filled adhesive is an adhesive film where a fill material such as alumina or boron nitride is added to an adhesive resin, for example LocTite makes an adhesive which uses boron nitride as a fill material. Some fill materials can be used occupy up to 80% of the adhesive. When cured the adhesive is nearly impossible to pry off a die and resistant to chemical decapsulation.

In another embodiment, barrier 106 is silicon as used extensively in stacked-die applications. In an alternate embodiment, a waste die, such as those dies which fail to measure up to testing, is used for barrier 106. The waste die has the added advantage that nonfunctioning circuitry would be etched in barrier 106 so visual inspection or probing with devices such as x-rays would be obscured by the nonfunctioning circuitry.

Another option for material for barrier 106 is a ceramic material. Ceramics are more resistant to drilling and etching than silicon. Some ceramic materials are nearly as hard as diamond and would fracture before they could be drilled through. Because of the strength of adhesive 104, if barrier 106 fractures, it will cause die 102 to fracture and become inoperable, thus, protecting the sensitive information in the circuitry fabricated on die 102.

In another embodiment, barrier 106 can be a functional fabricated die. In order for operable circuitry to function, bond wires are needed to couple the circuitry on barrier 106 to output pin outs in a fashion similar to barriers with sensor circuitry described below for FIG. 3. For example, the circuitry on barrier 106 could comprise control circuitry for a POS device, while die 102 could comprise memory which contains sensitive data. Information on the barrier is not sensitive, but tampering with the barrier would result in the destruction of sensitive die 102.

Typically, stacked-die packages use either a pyramid or inverted pyramid configuration. A pyramid configuration has the largest die on the bottom with the dies getting smaller as the stack progresses upwards. An inverted pyramid configuration has the smallest die on the bottom with the dies getting larger as the stack progresses upwards. While either configuration can be used, an inverted pyramid configuration allows barrier 106 to completely obstruct access to sensitive die 102. Furthermore, if barrier 106 is large enough it can also obstruct access to wire bonds 108.

Figure 2A:
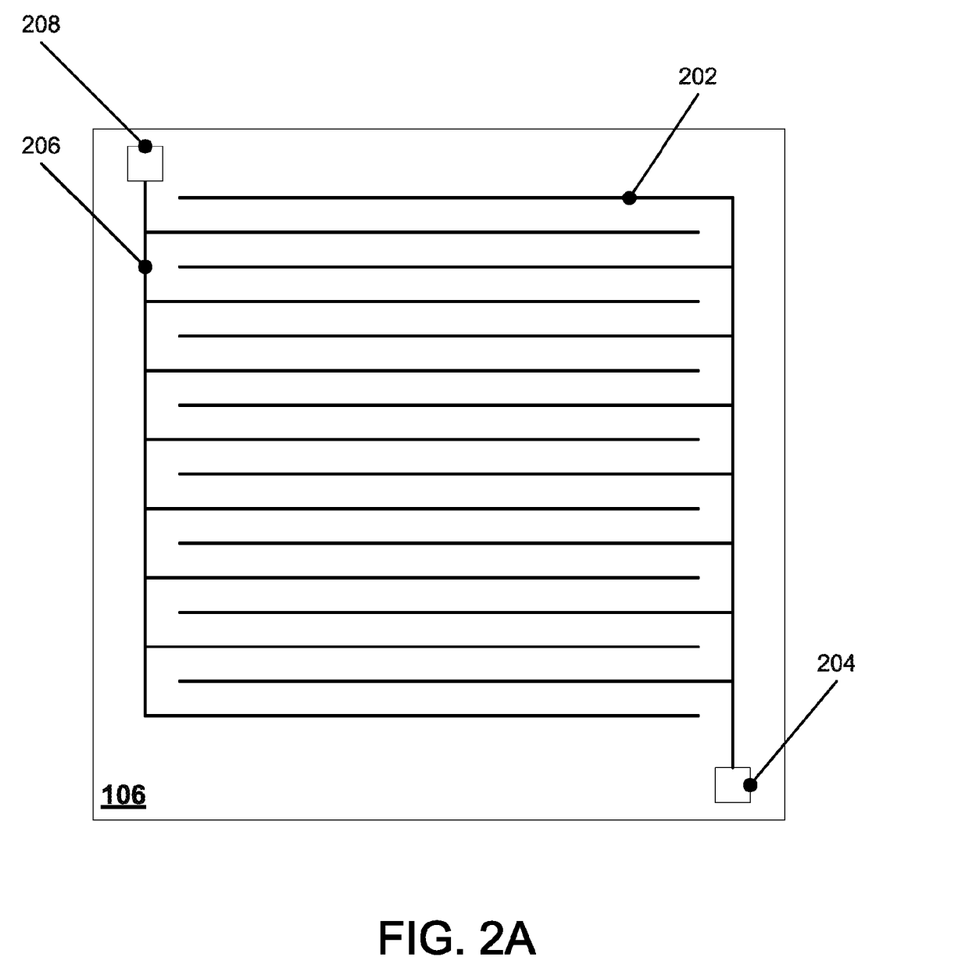
FIGS. 2A-2E show examples of sensor circuitry that can be added to a barrier.

Sensor circuitry can be used as a further means to detect intrusion. FIGS. 2A-E show embodiments of sensor circuitry that can be fabricated on top of barrier 106. FIG. 2A shows one embodiment of a sensor circuit comprising two conductors. Conductor 202 is connected to bond pad 204 which can be coupled through wire bond to the package's power source such as a $V_{CC}$ power line. Conductor 206 is connected to bond pad 208 which can be coupled through a wire bond to an output pin out. When a metal probe or instrument intrudes, it may form a connection between conductor 202 and conductor 206 causing a short circuit. When this happens the voltage detected on conductor 206 goes to $V_{CC}$. The pattern of the conductors is shown in a parallel lines fashion, but any pattern that keeps conductor 202 and 206 in close proximity can be used. The advantage of this configuration is that only one additional output pin out is needed to connect to conductor 206 via bond pad 208. Conductor 202 can be connected via bond pad 204 to an existing power output pin out.

Figure 2B:
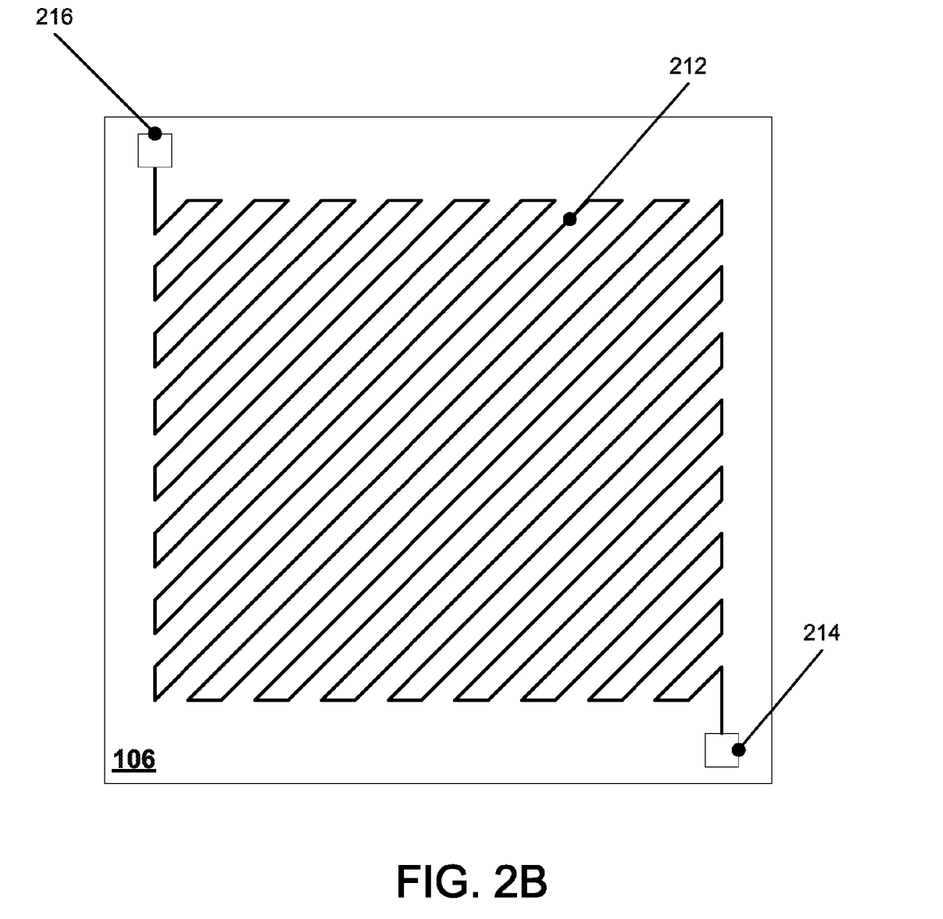

FIG. 2B shows another embodiment of a sensor circuit comprising a single conductor. Conductor 212 is patterned to fill up the space on top of barrier 106. A "zig-zag" space filling curve pattern is shown here but any other pattern such as a serpentine pattern could be used. The ends of conductor 212 are connected to bond pads 214 and 216. Each bond pad is attached through a wire bond to a sensing output pin out. A current can be run through conductor 212. If conductor 212 is broken by intrusion, no current can flow through conductor 212. The advantage of this approach is the simplicity of design, but this embodiment does use two output pin outs.

Figure 2C:
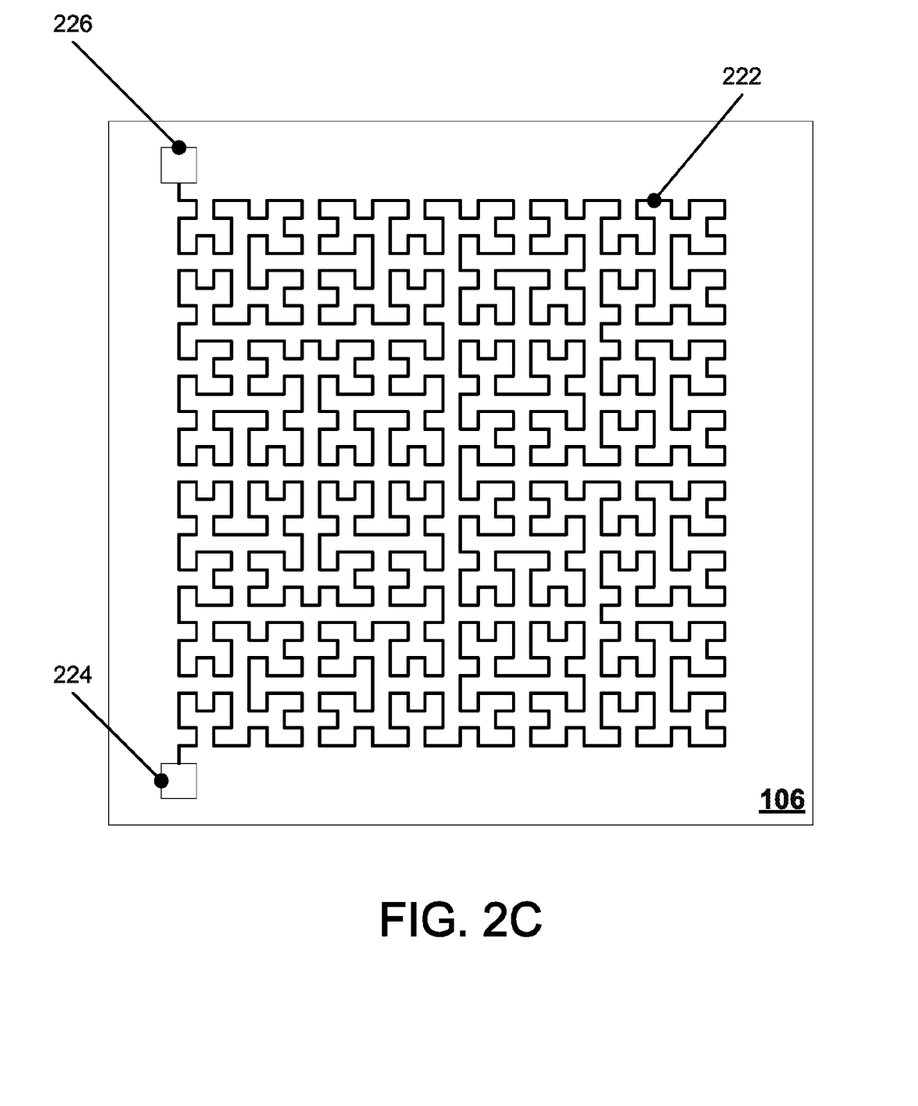

FIG. 2C shows another embodiment of a sensor circuit comprising single conductor 222 which functions similarly to conductor 212 described for FIG. 2B and is connected to output sensing pin outs through wire bonds to bond pads 224 and 226. Rather than the "zig-zag" space filling curve, a Hilbert space filling curve pattern is used.

Figure 2D:
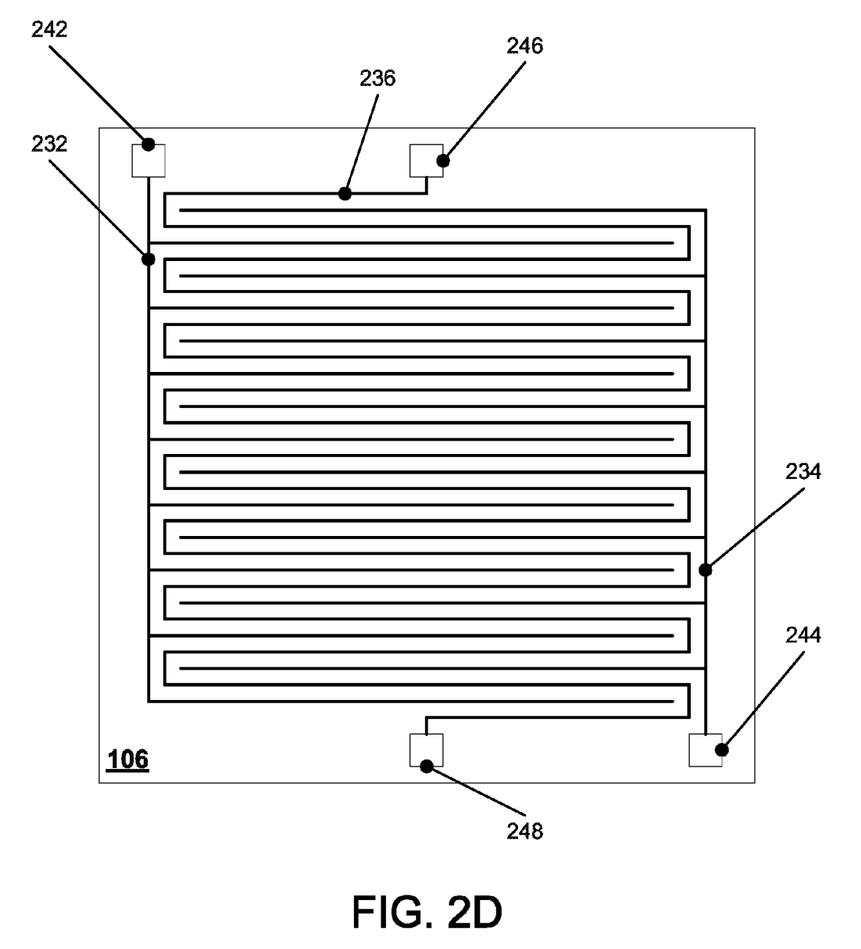

FIG. 2D shows yet another embodiment of a sensor circuit, which comprises power line conductor 232 coupled to bond pad 242, sensing conductor 236 coupled to bond pads 246 and 248 and optionally ground conductor 234 coupled to bond pad 244. Bond pad 242 can be connected to a power output pin out with a bond wire. Bond pad 244 can be connected to a ground output pin out with a bond wire. Bond pad 246 and 248 are connected by bond wire to sensor output pin outs. This approach is a hybrid of the approaches described in FIGS. 2A and 2B. Intrusion is detected when a short between sensing conductor 236 and power line conductor 232 and/or ground conductor 234 is detected. Furthermore, intrusion is also detected when sensing conductor 236 is severed leading to no current between the two sensing output pin outs.

Figure 2E:
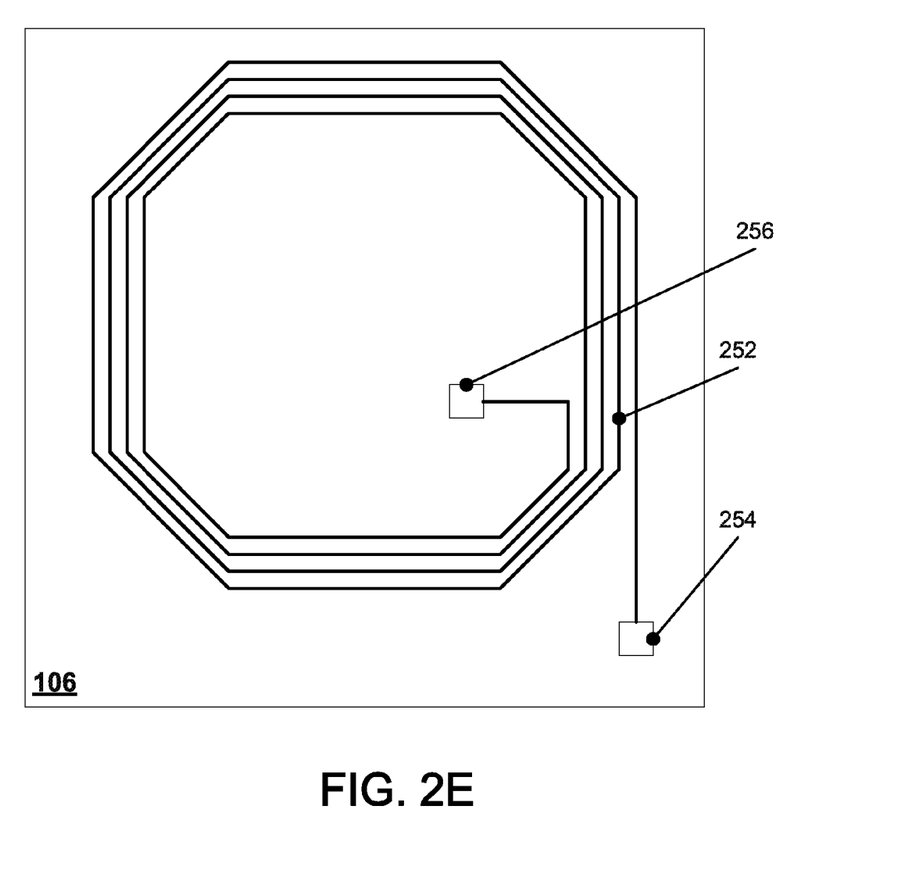

FIG. 2E shows yet another embodiment of a sensor circuit. Conductor 252 is patterned in a coil pattern on top of barrier 106, which forms an inductor. Conductor 252 is connected to bond pads 254 and 256, each can be connected via wire bond to output pin outs. While typically bond pads are fabricated on the periphery of a substrate, here bond pad 256 is fabricated in an internal position. The coil has native inductance, but when a metal object particularly one containing iron passes near the inductor the magnetic field generated by the inductor is disturbed and the inductance changes. This change in inductance can be detected by a circuit coupled to the output pin outs. Furthermore, since conductor 252 also forms a circuit, if the coil pattern also fills the surface of barrier 106, it also can function as a physical intrusion detector similar to that described in FIG. 2B. The advantage of this sensor circuit is that it can detect the proximity of an intrusion device.

It should be noted that the specific patterns described above are examples and that other patterns can be used as well. A desirable pattern would maintain a pitch (the spacing between nearby segments of the same or different conductors) that is much smaller than metal instruments that are used to probe chips. The pattern would also essentially cover the barrier leaving only small gaps between conductors and around the perimeter of the barrier. Furthermore, other more complex sensor circuits could be use such as circuits that detect excessive electromagnetic radiation which would be indicative of probing by x-rays or other electromagnetic fields. Whether by induction, physical shorting, physical circuit breaking or electromagnetic detection, upon detection of intrusion using the sensor circuit, a processor coupled to the semiconductor package can shutdown or cause sensitive memory within the circuitry fabricated on die 102 to be erased.

Figure 3:
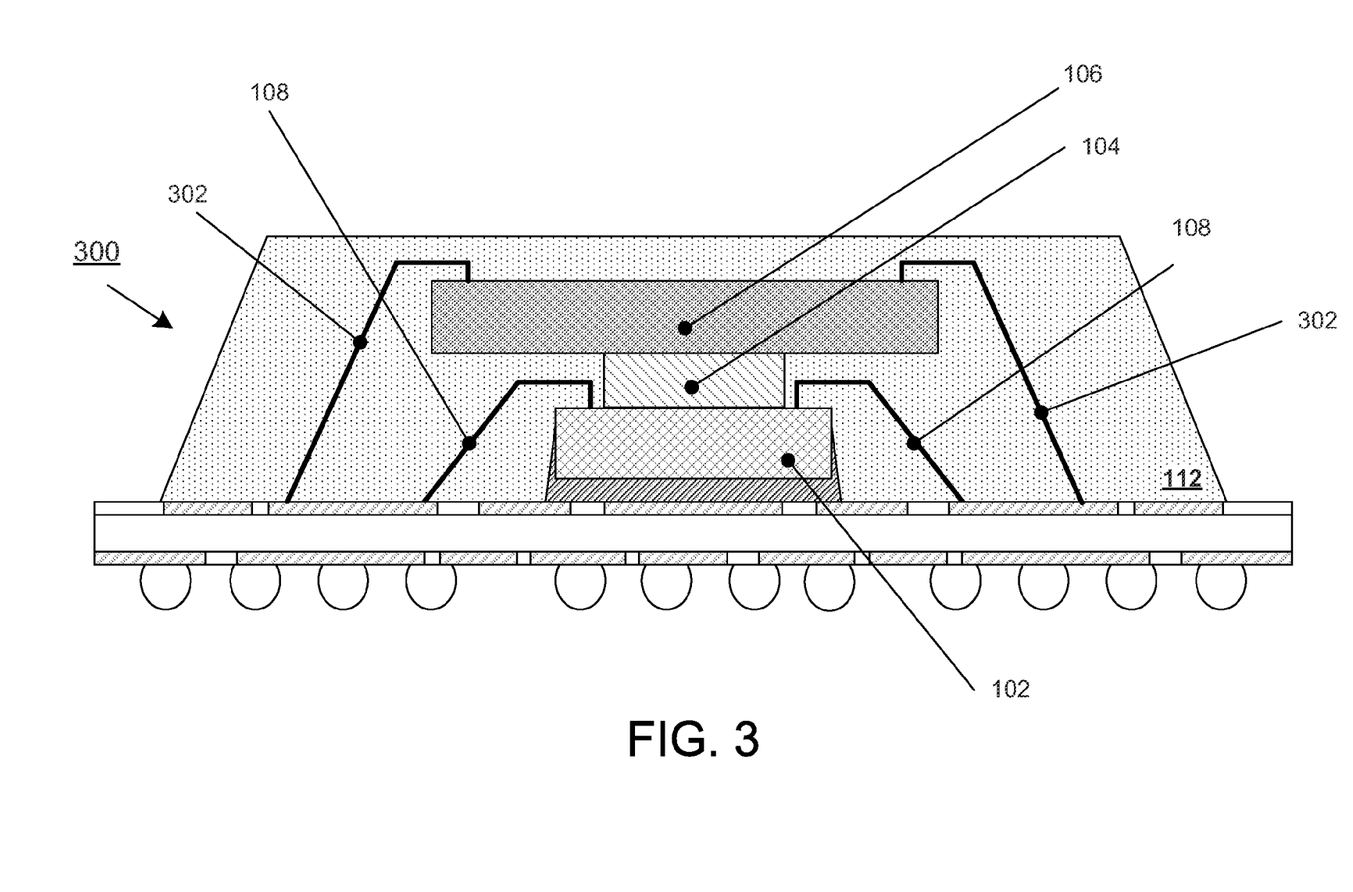
FIG. 3 is a cross-sectional view of a package employing sensor circuitry fabricated on a barrier.

FIG. 3 is a cross sectional view of an embodiment of a tamper resistant package using sensor circuitry added to barrier 106. In addition to the sensor circuitry (examples are shown in the top views in FIGS. 2A-E), package 300 further comprises wire bond 302 used to connect the bond pads associated with the sensor circuitry to the output pin outs. While bond wires are made from a variety of materials, due to performance requirements, bond wires 108 that are attached to die 102 may be required to use a specific material. However, because, in general, sensor circuitry usually doesn't have these performance requirements, bond wires 302 connected to sensor circuitry on barrier 106 can be made of any conductive material. For example, performance of circuitry on die 102 may dictate that bond wires 108 be made of a noble metal such as gold. However, bond wires 302 could be made of a non-noble metal such as copper or aluminum rather than as gold. This choice can be made for cost reasons, however, the cheaper metals are more susceptible to chemical corrosion. While generally this is a negative property, susceptibility to chemical corrosion adds an additional measure of protection from decapsulation techniques that use materials such as fuming nitric acid. Unlike gold, copper and aluminum will react to corrosive reagents such as nitric acid. If an intruder attempts to decap the package using fuming nitric acid, bond wires 302 would be consumed breaking the connection to the sensor circuitry. When a processor connected to the sensor circuitry detects the open circuit, it can trigger one of the countermeasures described above such as memory erasure.

Figure 4:
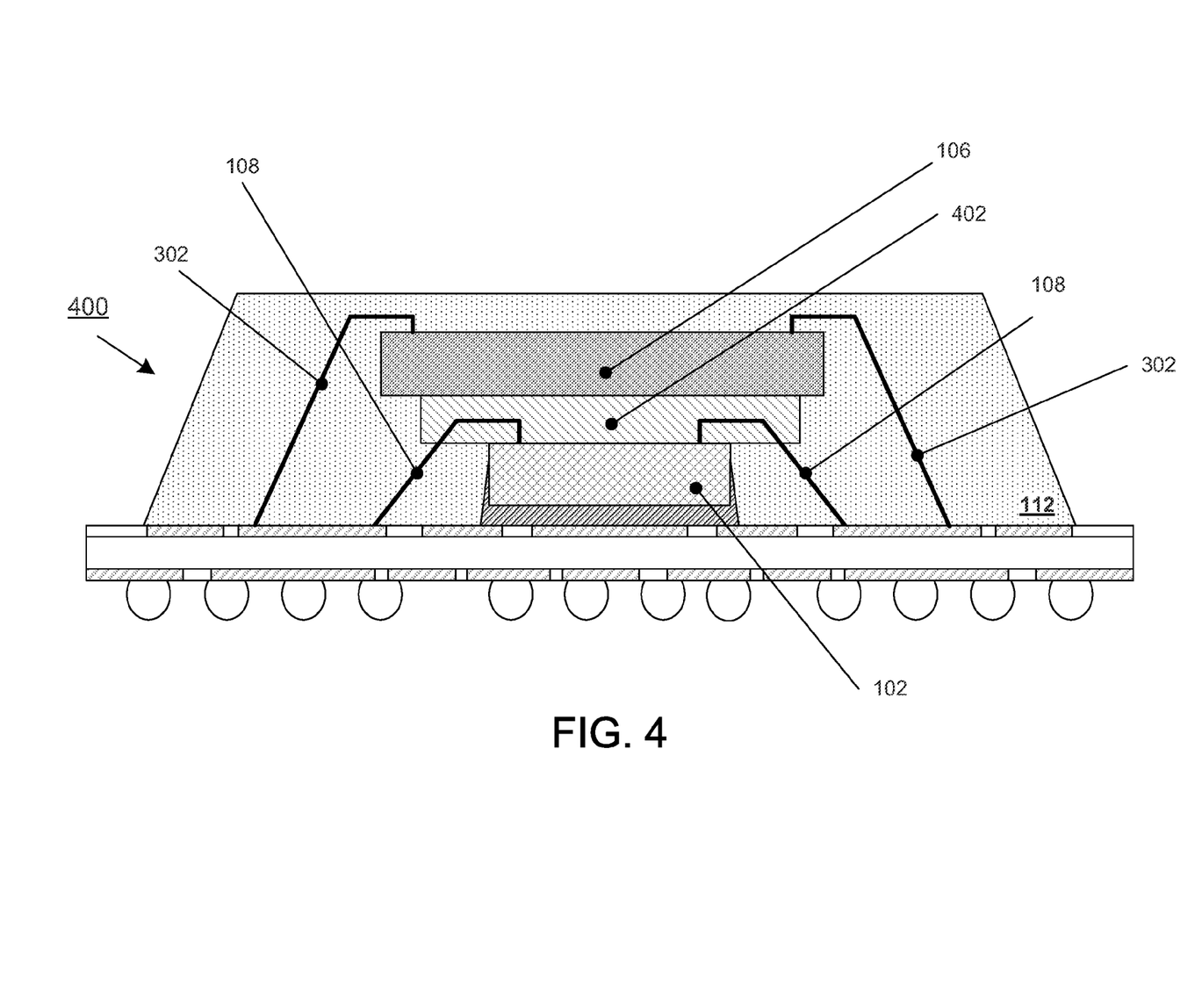
FIG. 4 illustrates the use of a chip-on-wire adhesive in attaching a barrier to a device.

FIG. 4 illustrates the use of a chip-on-wire adhesive in attaching barrier 106 to die 102. Package 400 uses chip-on wire adhesive 402 to bond barrier 106 to sensitive die 102. Unlike adhesive 104 in package 100, chip-on wire adhesive 402 also encapsulates at least some of bond wires 108. As a result, an attempt to remove barrier 106 in addition to possibly destroying die 102 also would dislodge bond wires 108 from die 102. Because at least some of the connection between the sensitive circuitry on die 102 is severed, the sensitive circuitry is rendered inoperable.

Chip-on-wire adhesives also known as film-on-wire such as adhesive 402 typically exhibit low modulus and low melt viscosity. The low melt viscosity insures that the bond wires are not displaced significantly during the bonding process. Additionally, low out-gassing and good gap filling are additional desirable properties of chip-on-wire adhesives since when the adhesive is pushed around a bond wire a gap could initially form. A good gap filling adhesive will fill the gap during the curing process. However, adhesives such as the filled adhesives used in adhesive 104 do not generally exhibit these properties. Therefore, there is often a tradeoff between an adhesive which causes the die to be destroyed during tampering and an adhesive which causes the bond wires to be detached during tampering. This can be an application specific choice. For example, if the die 102 contains sensitive information in non-volatile memory, physical destruction of the die is preferable. If the sensitive information is contained in a random access memory, removing the bond wires would suffice.

In embodiments where the barriers contain metallization such as a waste die is used, thermal imaging analysis and x-ray analysis is limited. Additionally, sensor circuitry particularly those that cover most of the surface of the barrier (such as in FIGS. 2A-D) also serve to further limit x-ray or thermal imaging analysis. To further hinder x-ray analysis, barrier 106 can be coated with an x-ray opaque material.

Figure 5:
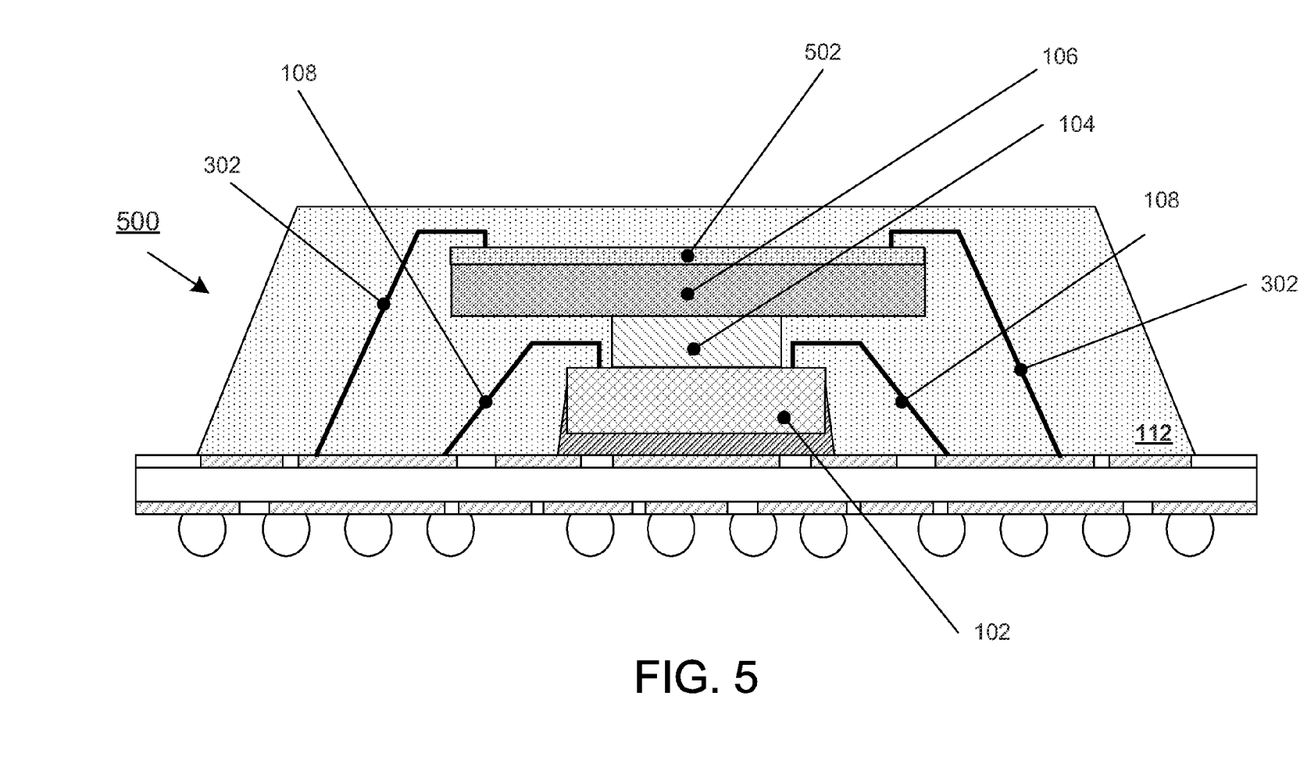
FIG. 5 illustrates a protective barrier layer with an additional x-ray opaque coating material.

FIG. 5 illustrates an embodiment of a semiconductor package having a protective barrier layer with an additional x-ray opaque coating material. Package 500 comprises barrier 106 which is coated with coating 502 comprising an x-ray opaque material. Generally, metals and especially heavy metals (atomically heavy) such as gold, lead, platinum, tungsten, and barium have x-ray opaque properties. Lead in general is not a good choice due to the toxicity of the metal and due to regulations prohibiting the use of lead. Gold and platinum are expensive. Other metals such as tin commonly used in the semiconductor packaging processing can also be used. Since tin is not as atomically dense as the heavy metals described above a thicker coating is needed to offer the same level of x-ray opaqueness as one of the heavy metals. While coating 502 can be a layer of metal such as tin, the coating could also be a filled material similar to a filled adhesive where the fill is an opaque material. In another embodiment, the coating 502 can have non-uniform thickness. Varied thickness adds another variable that would have to be accounted for by anyone attempting to tamper with package 500.

Figure 6:
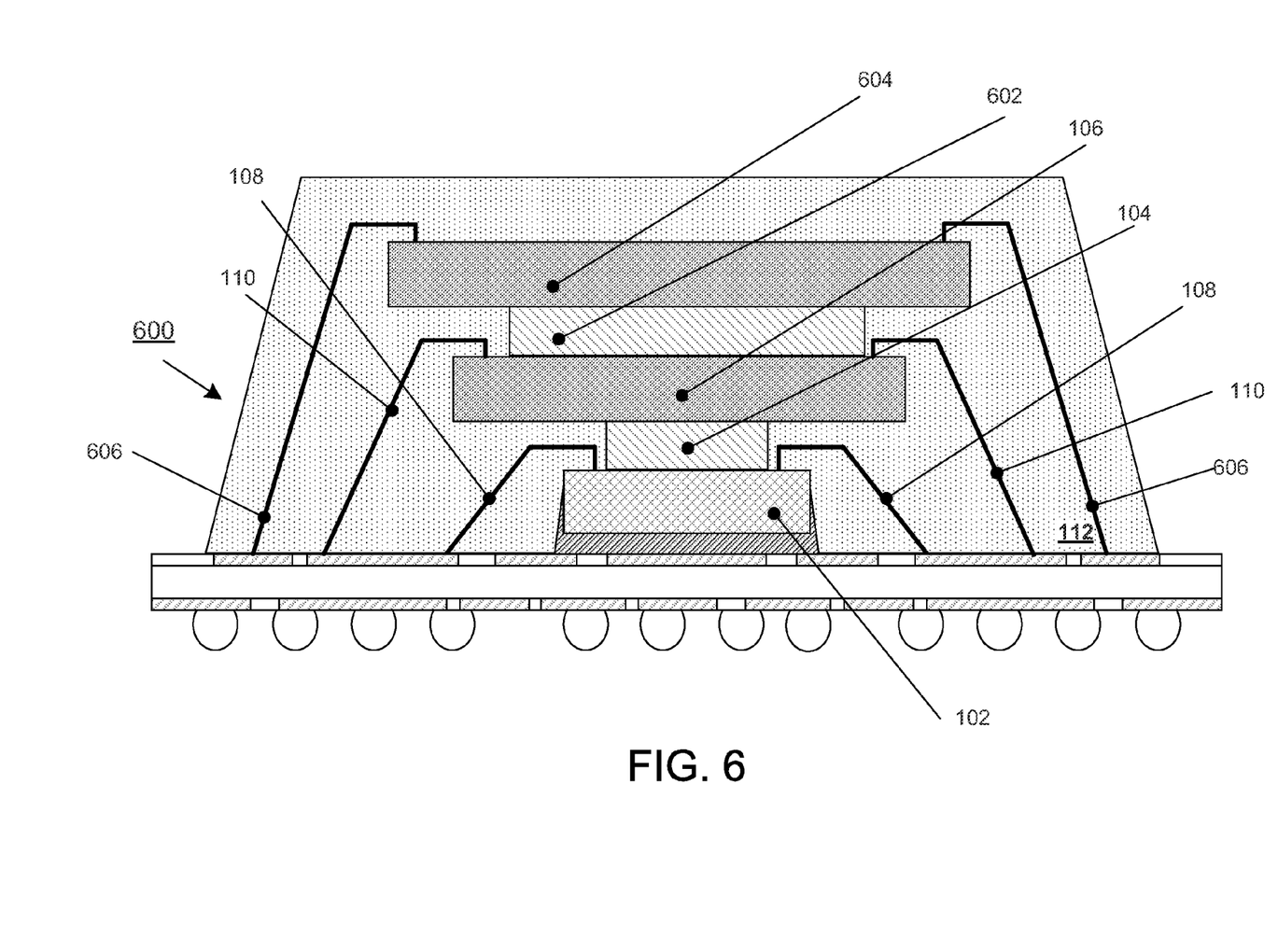
FIG. 6 illustrates a second protective barrier stacked on top of the first protective barrier.

More than one barrier layer can be stacked with or without sensor circuitry and with or without an x-ray opaque coating. FIG. 6 illustrates a second protective barrier stacked on top of the first protective barrier. In package 600, barrier 604 is attached to barrier 106 using adhesive 602 in a standard stacked-die configuration. Barrier 604 can comprise any of the materials described for barrier 106 including a dummy silicon die, a waste die or a piece of ceramic material.

In one embodiment, adhesive 602 is a tamper-resistant adhesive having properties as discussed for adhesive 104. Any attempt to remove adhesive 602 would cause barrier 106 to fracture which in turn would destroy die 102.

In another embodiment, barrier 106 has a sensor circuit placed on top of it, similar to that describe for package 300. Adhesive 602 can be a chip-on-wire adhesive similar to that described for adhesive 402 in package 400. Any attempt to remove adhesive 602 would dislodge bond wires 114 disconnecting the sensor circuitry from the output pin outs. This would then be detected by a processor which would take countermeasures.

In yet another embodiment, barrier 604 can also have sensor circuitry which can be similar to that of barrier 106 as described in package 300 of FIG. 3 or it may have complementary sensor circuitry. For example, the sensor circuitry on barrier 106 could detect short circuits and open circuits while the sensor circuitry on barrier 604 could be sensitive to high levels of electromagnetic radiation suggestive of x-ray probing. The sensor circuitry (not shown) on top of barrier 604 is connected to output pin outs by bond wires 606. Also, the barrier 604 can also hide the presence of sensor circuitry on top of barrier 106. By further hiding intrusion countermeasures such as sensor circuitry, it makes it even more difficult for anyone to probe sensitive die 102.

In yet another embodiment, barrier 604 can also comprise an x-ray opaque coating (not shown). There is a tradeoff between the cost of adding an additional x-ray opaque coating and additional protection from x-ray intrusion. For example, barrier 604 could have an x-ray opaque coating placed on top of it whereas barrier 106 does not.

Furthermore, additional barrier layers could be added in a stacked-die configuration. Depending on the level of protection desired, three, four or more barriers either of similar or different characteristics can be employed. In the latter case, one barrier could include a sensor circuit, another barrier could include an x-ray opaque coating, and still another could include another type of sensor circuit, so that the protection each barrier contributes is targeted towards a different threat.

Thus far, the tamper proofing structures and methods have been described in terms of protecting a single sensitive die in a semiconductor package. One or more of the barrier techniques can be applied to multiple die packages.

Figure 7:
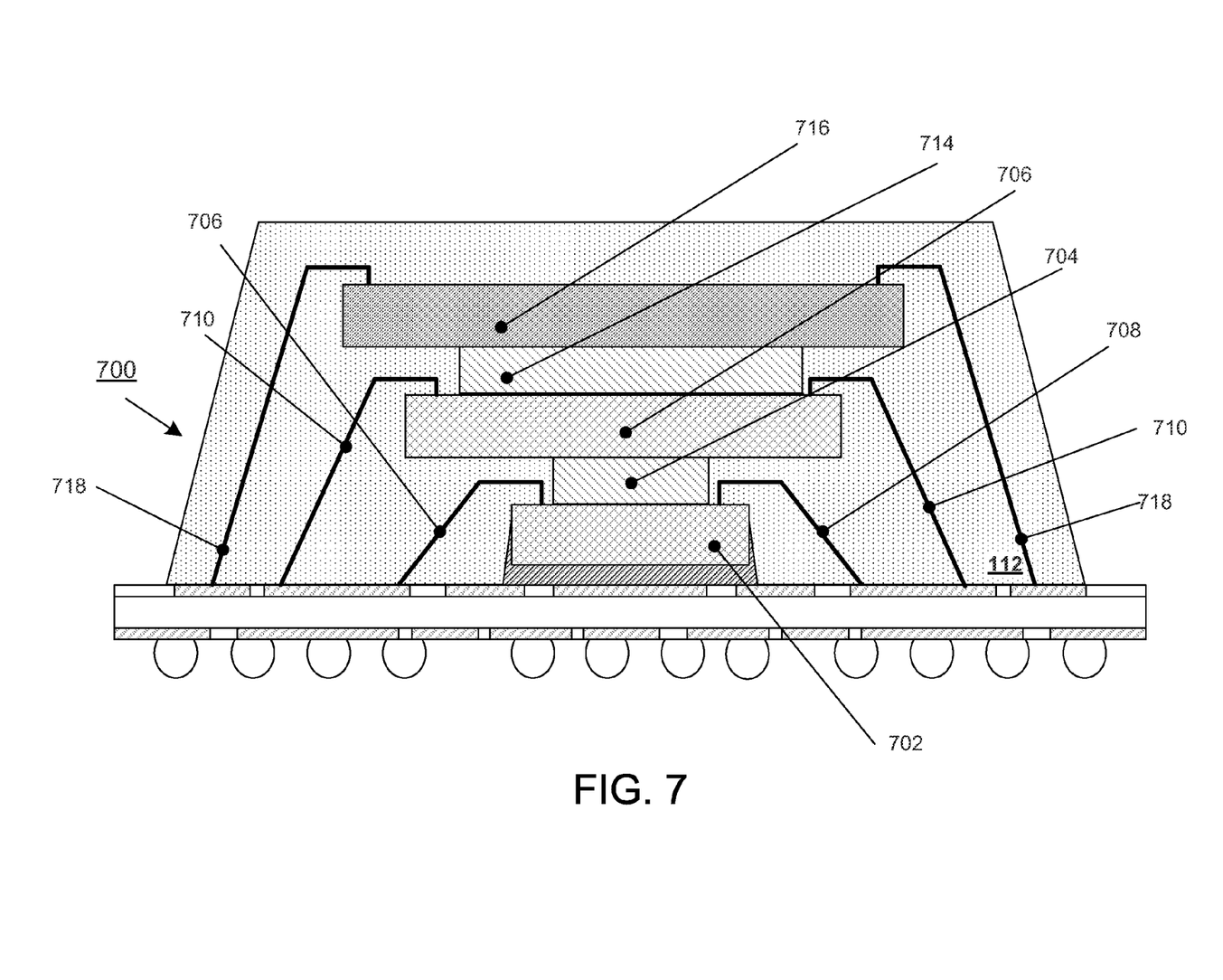
FIG. 7 illustrates an example where a barrier is used to protect a stacked-die structure comprising at least two sensitive dies.

FIG. 7 illustrates is an example of a tamperproof package comprising two sensitive dies. Package 700 comprises die 702 and die 706 in a stacked-die structure. Adhesive 704 is used to attach die 706 atop die 702. Adhesive 704 can comprise standard adhesives used in stacked-die applications or can be a tamper-resistant adhesive such as described for adhesive 104. Tamper-resistant adhesives would provide better protection against intrusion. Bond wires 708 are used to connect circuitry fabricated on die 702 to output pin outs. Bond wires 710 are used to connect circuitry on fabricated die 706 to output pin outs. Dies 702 and 706 along with adhesive 704 and wire bonds 708 and 710 comprise a standard two die stacked-die structure. Barrier 716 is attached to die 706 using adhesive 714. Barrier 716 can comprise dummy silicon, a waste die, or ceramic material as discussed above for barrier 106 in FIG. 1. This approach can be extended to protect stacked-die structures with three or more devices.

In another embodiment, an x-ray opaque coating could be applied on top of barrier 716 in a manner similar to that discussed in FIG. 4. In another embodiment, adhesives 704 and/or adhesive 714 can be chip-on-wire adhesives similar to that described in FIG. 3 with adhesive 704 partially encapsulating wire bonds 708 and/or adhesive 714 partially encapsulating wire bonds 710.

In another embodiment, sensor circuitry can be placed on top of barrier 716 similar to that described for FIGS. 2A-E. Bond wires 718 can be used to attach sensor circuitry to output pin outs. In another embodiment, additional barriers can be added on top of barrier 716 such as described in FIG. 6. Other combinations based on the previously described embodiments can also be employed.

Figure 8:
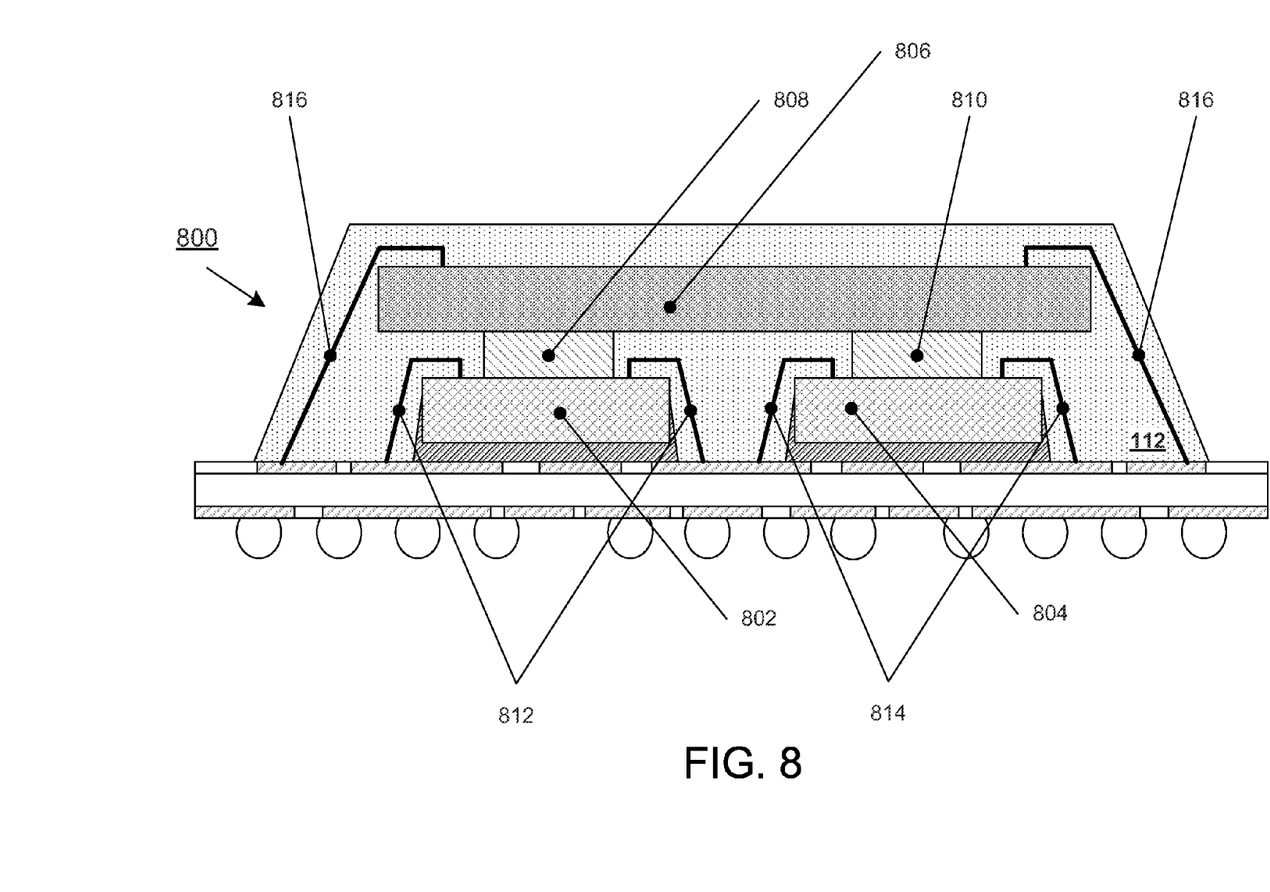
FIG. 8 illustrates another example of where a barrier is used to protect multiple sensitive dies.

Another multiple die package lays out multiple dies side by side rather than stacked. FIG. 8 shows a package having two dies laid out in adjacent to each other. Package 800 comprises sensitive die 802 and sensitive die 804. The circuitry on dies 802 and 804 are connected to output pin outs through wire bonds 812 and 814 respectively. To protect dies 802 and 804 from tampering, barrier 806 is attached to both dies. As shown here in this example, adhesive 808 and 810 are used to attach barrier 808 to dies 802 and 804, respectively. In one embodiment, adhesives 808 and 810 are tamper-resistant adhesives.

In another embodiment, an x-ray opaque coating could be applied on top of barrier 806 in a manner similar to that discussed in FIG. 4. In another embodiment, adhesives 808 and/or adhesive 810 can be chip-on-wire adhesives similar to that described in FIG. 3 with adhesive 808 partially encapsulating wire bonds 812 and/or adhesive 810 partially encapsulating wire bonds 814.

In another embodiment, sensor circuitry can be placed on top of barrier 806 similar to that described for FIGS. 2A-E. Bond wires 816 can be used to attach sensor circuitry to output pin outs. In another embodiment, additional barriers can be added on top of barrier 806 such as described in FIG. 6. Other combinations based on the previously described embodiments can also be employed.

The advantage of the packaging technique is that no reengineering of a sensitive device needs to be performed to add security. The protection can be added during the packaging, making the engineering of the sensitive device simpler. The additional packaging adds very little cost over a non-tamper proof package. As an additional benefit the addition of a barrier layer can also act as a heat spreader at no additional cost. The barrier itself can also be a device which may comprise less sensitive functionality.

The stacking architecture uses existing packaging techniques and provides protection against physical intrusion because any attempt to physically remove the barrier will cause the passivation layer and likely the metal lines of the device to be damaged rendering the device inoperable. The barrier can also be used to protect against x-ray, thermal imaging. Sensor circuitry on the barrier using non-noble metal bond wires can provide protection against a chemical attack.

It should be emphasized that the above-described embodiments are merely examples of possible implementations. Many variations and modifications may be made to the above-described embodiments without departing from the principles of the present disclosure. For example, the above-described diagrams show ball grid array (BGA) packaging, but the packaging technique described can be applicable to other types of packaging including but not limited to dual in-line package (DIP) packaging, pin grid array (PGA) packaging, leadless chip carrier (LCC) packaging, small-outline integrated circuit (SOIC) packaging, plastic leaded chip carrier (PLCC) packaging, plastic quad flat pack (PQFP) packaging and thin quad flat pack (TQFP) packaging, thin small-outline packages (TSOP) packaging, land grid array (LGA) packaging and Quad-Flat No-lead (QFN) packaging. All such modifications and variations are intended to be included herein within the scope of this disclosure.

What is claimed:

1. A tamper proof semiconductor package comprising:
    a semiconductor die having fabricated circuitry;
    a barrier layer;
    a tamper-resistant adhesive bonding the barrier layer to the semiconductor die;
  wherein the tamper-resistant adhesive damages the semiconductor die when the barrier layer is removed;
    a sensor circuit fabricated on top of the barrier layer; and
    an encapsulation layer completely covers the barrier layer, the semiconductor die, and the tamper-resistant adhesive.

2. The semiconductor package of claim 1, wherein the barrier layer comprises silicon.

3. The semiconductor package of claim 1 wherein the barrier layer comprises a ceramic.

4. The semiconductor package of claim 1 wherein the barrier layer comprises a waste die.

5. The semiconductor package of claim 1 wherein the barrier layer comprises a second semiconductor die having fabricated circuitry.

6. The semiconductor package of claim 1 further comprises an x-ray opaque coating on top of the barrier layer.

7. The semiconductor package of claim 6 wherein the x-ray opaque coating comprises tin.

8. The tamper proof semiconductor package of claim 1 further comprising:
    a package substrate; and
    wherein the chip-on-wire tamper-resistant adhesive bonds the package substrate to the semiconductor die and the barrier layer.

9. A tamper proof semiconductor package comprising:
    a semiconductor die having fabricated circuitry;
    a barrier layer comprising a sensor circuit;
    a first bond wire electrically coupling the fabricated circuitry to an output pin out;
    a second bond wire electrically coupling the fabricated circuitry to a sensor output pin out;
    a tamper-resistant adhesive bonding the barrier layer with the semiconductor die;
    wherein the sensor circuit fabricated on to of the barrier layer; and
    an encapsulation layer completely covers the barrier layer, the semiconductor die, and the tamper-resistant adhesive.

10. The tamper proof semiconductor package of claim 9, wherein the barrier layer comprises silicon or a ceramic.

11. The tamper proof semiconductor package of claim 9 wherein the barrier layer for protecting against x-ray or thermal probing.

12. The tamper proof semiconductor package of claim 9 wherein the sensor circuit for detecting intrusion.

13. The tamper proof semiconductor package of claim 9 wherein the second bond wire comprises a non-noble metal.

14. The tamper proof semiconductor package of claim 9 wherein the sensor circuit comprises a sensor conductor patterned to essentially cover the barrier layer said sensor conductor coupled to two sensor output pin outs.

15. The tamper proof semiconductor package of claim 9 wherein the sensor circuit comprises a power line conductor and a sensor conductor wherein the power line conductor and the sensor conductor are patterned to essentially cover the barrier layer.

16. The tamper proof semiconductor package of claim 15 wherein the sensor circuit further comprises a the ground conductor and a sensor conductor wherein ground conductor is patterned with the power line conductor and the sensor conductor to essentially cover the barrier layer.

17. The tamper proof semiconductor package of claim 9 wherein the sensor circuit comprises an inductor coupled to two sensor output pin outs.

18. The tamper proof semiconductor package of claim 9 wherein the tamper-resistant adhesive is a chip-on-wire adhesive which partially encapsulates the first bond wire.

19. The tamper proof semiconductor package of claim 9 further comprising:
    a package substrate; and
    wherein the chip-on-wire tamper-resistant adhesive bonds the package substrate to the semiconductor die and the barrier layer.

20. The tamper proof semiconductor package of claim 9 further comprising an encapsulant covering the semiconductor die, the barrier layer and the tamper-resistant adhesive.

21. The tamper proof semiconductor package of claim 20 wherein the encapsulant covers the first bond wire and the second bond wire, and the tamper-resistant adhesive does not cover the first bond wire and the second bond wire.

22. A tamper proof semiconductor package comprising:
    a semiconductor die having fabricated circuitry;
    a barrier layer;
    a bond wire electrically coupling the fabricated circuitry to an output pin out;
    a chip-on-wire tamper-resistant adhesive which bonds the barrier layer to the semiconductor die and which partially encapsulates the bond wire; and
    a sensor circuit fabricated on top of the barrier layer, wherein the barrier layer, the semiconductor die, and the chip-on-wire tamper-resistant adhesive are completely covered by an encapsulation layer.

23. The tamper proof semiconductor package of claim 22 further comprising:
    a package substrate; and
    wherein the chip-on-wire tamper-resistant adhesive bonds the package substrate to the semiconductor die and the barrier layer.

* * * * *

UNITED STATES PATENT AND TRADEMARK OFFICE
CERTIFICATE OF CORRECTION

| | | |
|---|---|---|
| PATENT NO. | : 8,455,990 B2 | Page 1 of 1 |
| APPLICATION NO. | : 12/713141 | |
| DATED | : June 4, 2013 | |
| INVENTOR(S) | : Robert W. Warren, Hyun Jung Lee and Nic Rossi | |

It is certified that error appears in the above-identified patent and that said Letters Patent is hereby corrected as shown below:

In the Claims:

Column 8, line 50, replace "to" with "top"
Column 8, line 58, insert --is-- after "layer"
Column 8, line 61, insert --is-- after "circuit"
Column 9, line 7, delete the second occurrence of "the"

Signed and Sealed this
Thirtieth Day of July, 2013

Teresa Stanek Rea
*Acting Director of the United States Patent and Trademark Office*